US007301174B1

(12) United States Patent
Popovich

(10) Patent No.: US 7,301,174 B1
(45) Date of Patent: Nov. 27, 2007

(54) LIGHT EMITTING DIODE STRIP LAMP

(76) Inventor: John M. Popovich, 130 S. Cedros, Unit 170, Solana Beach, CA (US) 92075

( * ) Notice: Subject to any disclaimer, the term of this patent is extended or adjusted under 35 U.S.C. 154(b) by 365 days.

(21) Appl. No.: 10/917,723

(22) Filed: Aug. 12, 2004

(51) Int. Cl.
*H01L 29/18* (2006.01)

(52) U.S. Cl. ..................... 257/88; 257/99; 257/E25.02; 362/391

(58) Field of Classification Search ................ 362/249, 362/391, 800; 257/88, 99, E25.02
See application file for complete search history.

(56) References Cited

U.S. PATENT DOCUMENTS 6,880,955 B2 * 4/2005 Lin ........................... 362/249

* cited by examiner

*Primary Examiner*—Minh-Loan Tran
(74) *Attorney, Agent, or Firm*—William W. Haefliger

(57) ABSTRACT

LED strip lamp comprising a light emitting diode and extruded electrodes characterized in that a shaped electrode of that LED is fixed directly to a diode connecting part on a current supplying conductor, by die bonding or other fixing means, an insulating painted layer on the current supplying conductor being locally absent, exposing a core wire, wherein the current supplying conductor comprises a metal wire rod having said insulating painted layer thereon.

13 Claims, 10 Drawing Sheets

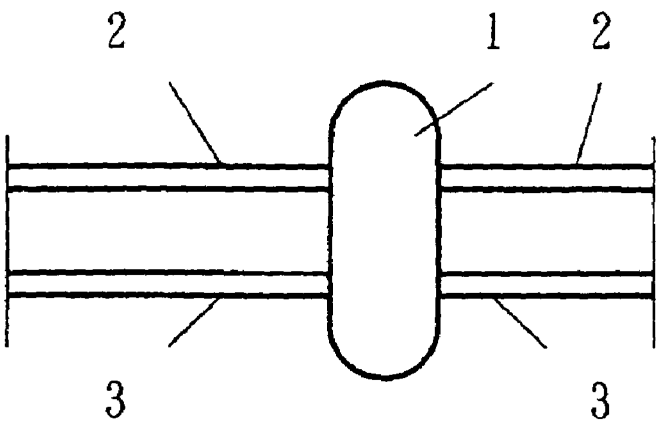
FIG. 1.
FIG. 2.
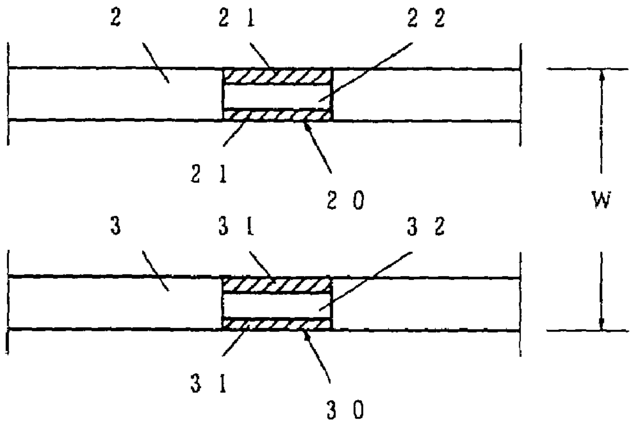

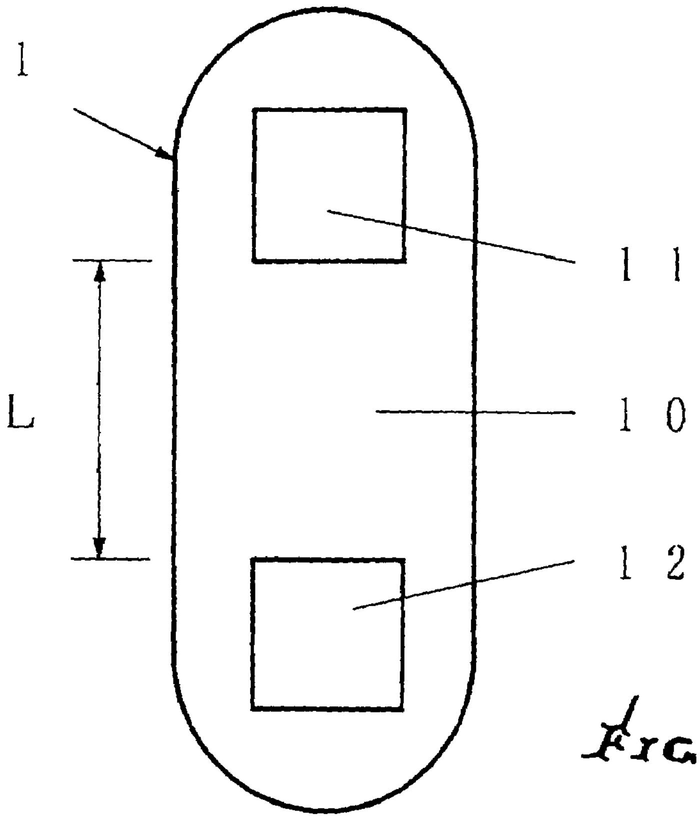
FIG. 3.
FIG. 4.
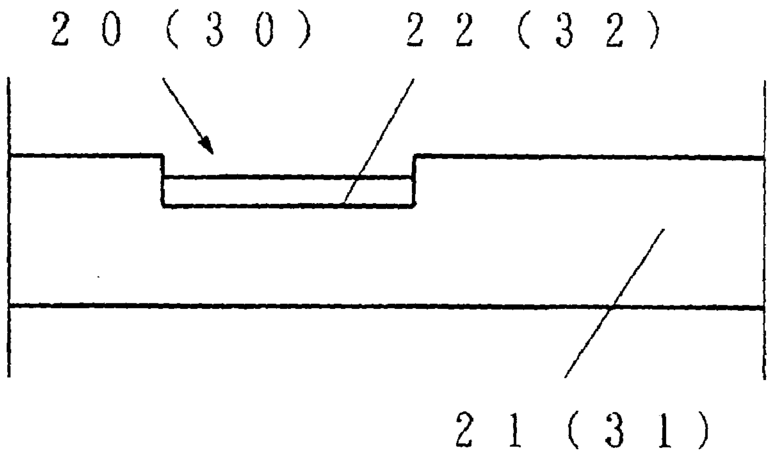

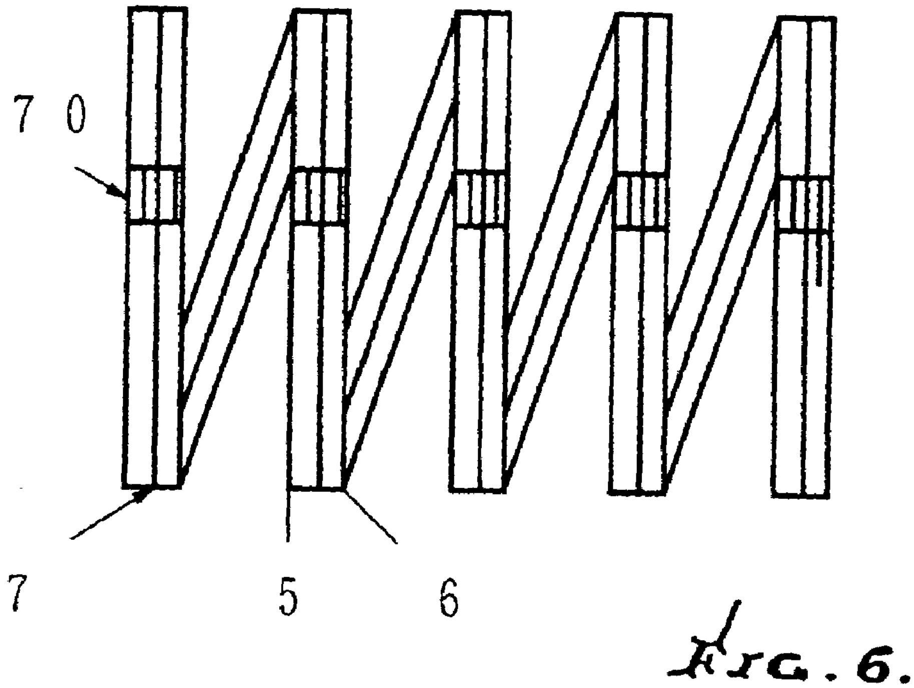
FIG. 6.
FIG. 7.
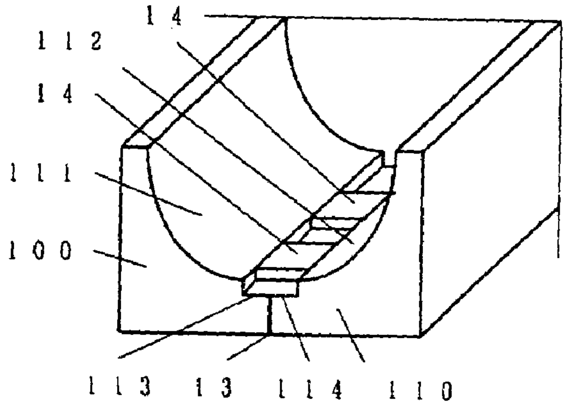

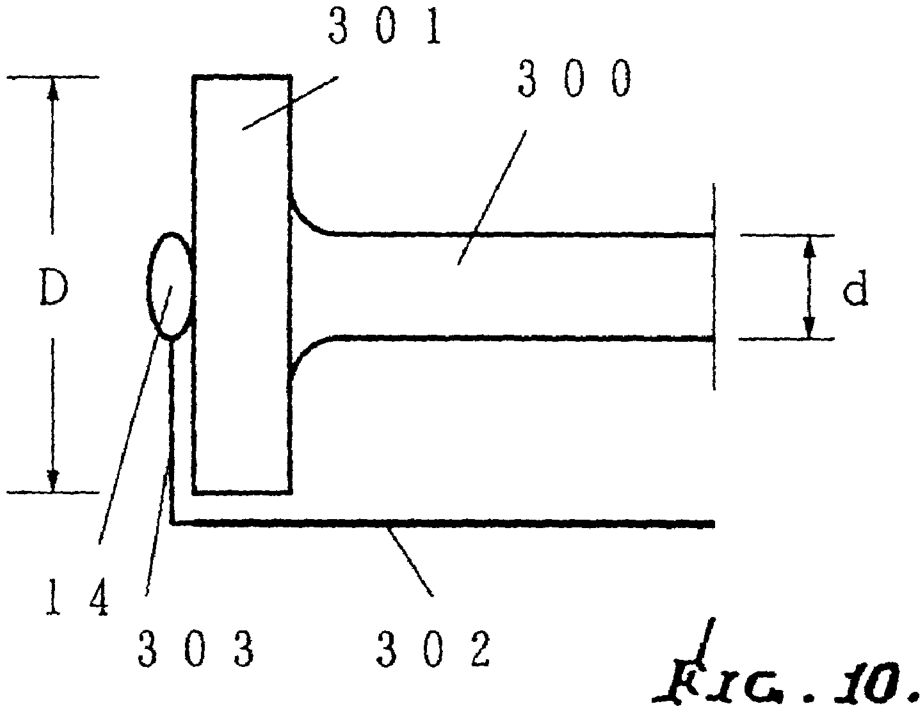
FIG. 10.
FIG. 11.
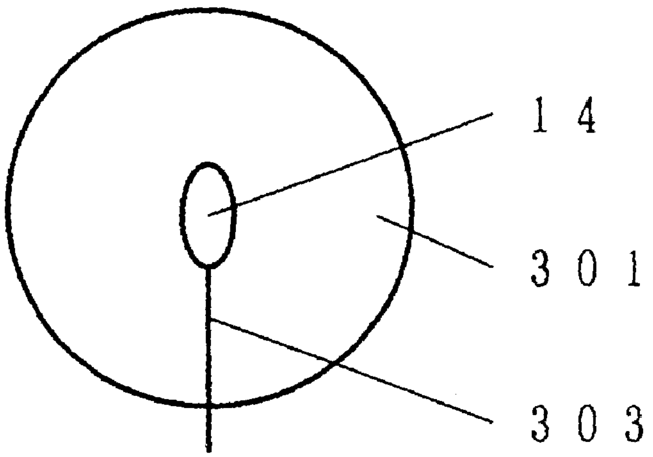

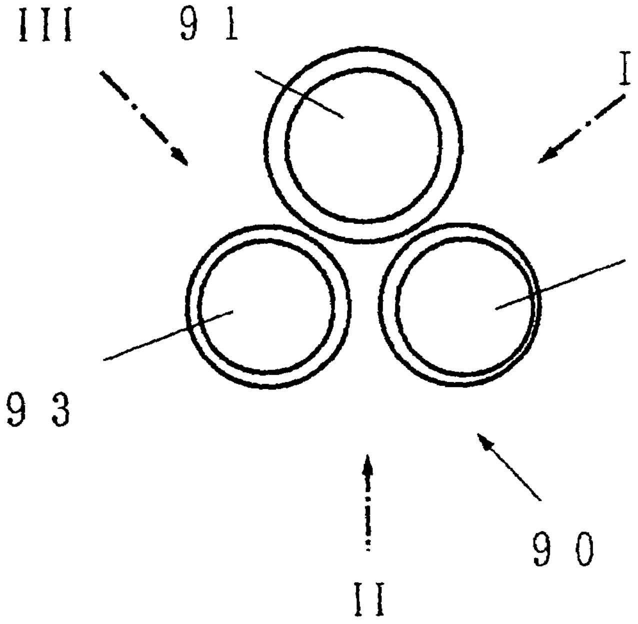
FIG. 13.
FIG. 14.
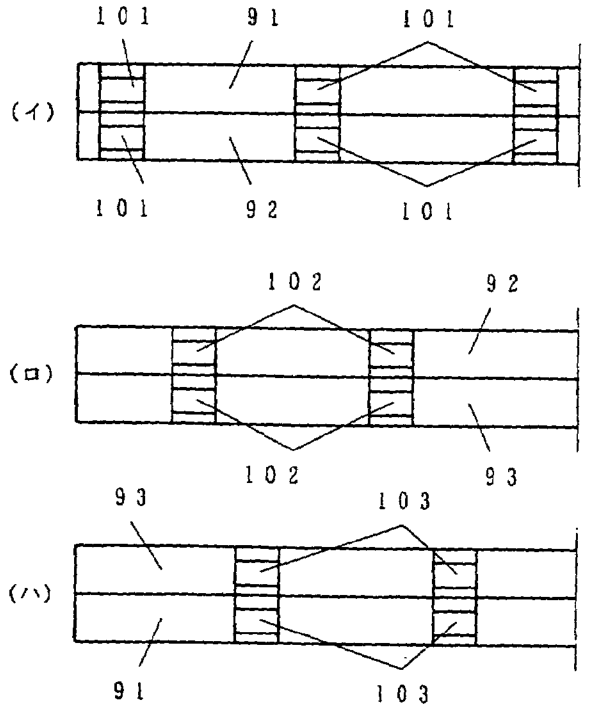

LIGHT EMITTING DIODE STRIP LAMP

BACKGROUND OF THE INVENTION

This invention relates generally to improvements to LED strip lamps consisting of an emitting diode and an extruded electrode, which is connected to a current supplying conductor, and especially to direct connection to an electrical current supplying conductor. Purposes are to provide an LED lamp and circuitry featuring high heat dissipation efficiency, and free placement capability in or on support means; elimination of need for a printed circuit board associated with the LED; and improved production methods.

Conventional LEDs generally incorporate a substrate, a light emitting part including a light emitting layer formed on a laminated nitride semiconductor on a substrate, and an electrode which protrudes behind or at a rim of the light emitting part, connected to a current supplying conductor of a current supplying cable. The said conventional LED is generally known as respects a current supplying conductor connected to a current supplying cable that needs special form in its configuration to secure firm connection between the electrode provided at the backside of the light emitting part and the current supplying conductor. Also, wire bonding is used to connect the electrode and current supplying conductor. Wire bonding is also used to connect between another electrode and the current supplying conductor.

As for general LEDs and referring to FIG. 15 herein, light emitting part (a) is covered by transparent polymer (d) which is encapsulated, and two electrode wires (b), (c) protrude from polymer (d). The LED secures insulation between light emitting part (a) and electrode wires (b), (c) as by encapsulation of light emitting part (a). Also, by increasing the optical size of transparent polymer (d), the internal reflection prospects of the transparent polymer are decreased, and output emission from transparent polymer (d) to the exterior is increased. Further, by changing the configuration and dimensions of transparent polymer (d), the LED can control internal reflection, and spectral angle of outer reflection.

However, in a conventional LED, it is difficult to transport or transfer generated heat fully to the local environment, as from the light emitting part, as current is supplied to the LED; and placement of multiple LEDs at a high density mounting is not practical, so the placement positions of LEDs are limited. Also, as stated in P.H06-275865, the current supplying conductor is continually made of solid metal, so the position of LED placement cannot be changed once connection is made to the current supplying conductor, lead wire being used as current supplying conductor. However such a lead wire is coated with insulation material, so that it is difficult to obtain better heat transportation, which leaves the high temperature issue unsettled. Further, light emission is all-directional and dispersion of emission makes it difficult to intensify the light beamed toward a specific direction unless a reflective mirror or other means of collection of light is used, and this complicates structure and increases manufacturing cost.

SUMMARY OF THE INVENTION

The purpose of the present invention is to improve the LED strip lamp and its manufacturing method, by solving the above stated problems, as by increasing heat dissipation capability, also needed are ways of high density LED mounting, contributing to free placement design, and contributing to free placement design, and adjustment of LED positioned after their connections to conductors.

These and other objects and advantages of the invention, as well as the details of an illustrative embodiment, will be more fully understood from the following specification and drawings, in which:

DRAWING DESCRIPTION

FIG. 1 is an outline of an embodiment of this invention;

FIG. 2 is an enlargement of a diode connecting part on a current supplying conductor;

FIG. 3 is a backside view of an LED;

FIG. 4 is an enlarged view of a diode connecting part on a current supplying conductor;

FIG. 6 is a view showing second embodiment LED placement position adjustment;

FIG. 7 is a wall-eyed drawing for a third embodiment of this invention;

FIG. 10 is a view of a fifth embodiment;

FIG. 11 is a plan view of the fifth embodiment;

FIG. 13 is a cross section showing a seventh embodiment;

FIG. 14 is a side view of the seventh embodiment;

GLOSSARY

Figure 5:
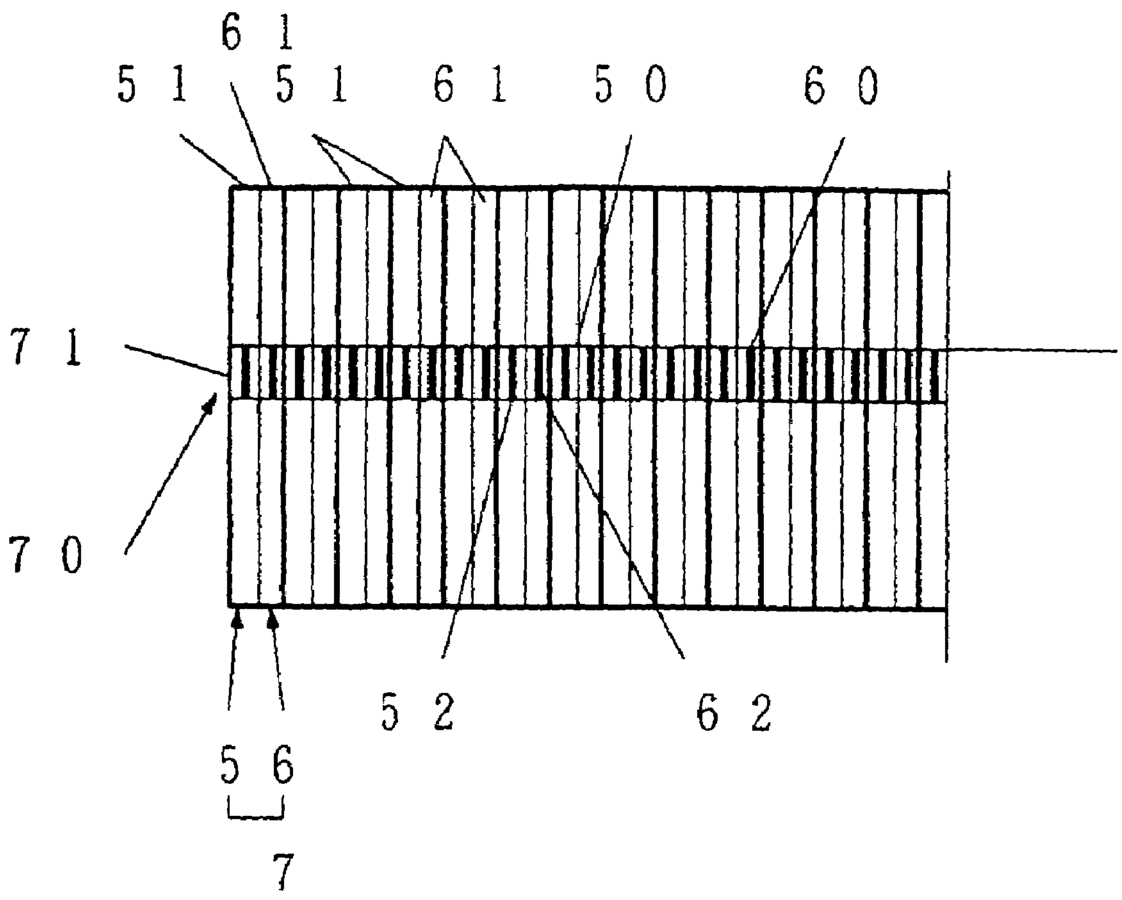
FIG. 5 is a view of a second embodiment of this invention.

1, 10, 14, 80 LED (Emission part), 11, 12 extruded (shaped) electrode;

2, 3, 5, 6 Current supplying conductor, 20, 30, 70 Connecting part;

21, 13, 31, 51, 61 Insulating paint layer;

22, 32, 52, 62 Conducting wire (core wire), 50, 60 (Exposed electrode);

7, 81 Current supplying cable, 71 Groove peeled;

81, 111, 112 Reflective surface, 113, 114 Exposed electrode;

301 Reflective pedestal, 302 Electric wire, 303 Wire bonding;

an Emitting part, b, c Electrode wire, d Transparent polymer

GENERAL DESCRIPTION OF INVENTION

To achieve the abovementioned purposes, the invention includes provision of an LED strip lamp consisting of an emitting diode and an extruded electrode, as claimed, having insulating paint coated wire which forms the core wire of the metal rod wire serving as current supplying conductor, and formation of a diode connecting part by local removal of an insulating paint layer. It is fixed directly to the diode connecting part on the current supplying conductor by die bonding or other fixing means. This contributes to a high reflective rate and intensity of LED light reflected toward the opposite direction of the core wire by virtue of the exposed metal surface of the metal core wire on a diode connecting part on a current supplying conductor. Also, a printed circuit board is not needed, and placement range, in length, can be determined freely as the LED is connected directly (by die bonding) to the current supplying conductor as by direct fixing of the LED to the diode connecting part on the current supplying conductor, by die bonding or other fixing means.

Also, the current supplying conductor (insulating paint coated wire) provides the feature of flexibility, so that the LED strip lamp can be deformed in not only two-dimensions but also in three-dimensions and set or installed at any desired position for placement as well as adjustment of emission range.

Also, by selecting insulating paint coated wire (enamel wire, magnet wire) for the current supplying conductor, efficiency of heat dissipation from the current supplying conductor is heightened and a large amount of heat generated at the LED is transported to the local environment, and the operating temperature of the LED can be decreased, whereby light emitting efficiency of the LED is enhanced, and spacing of LED placement positions becomes closer, whereby mounting density become higher. Also, insulating paint coated wire for the current supplying conductor contributes to inexpensive material, less cost, and reduction of manufacturing cost. As included in the following claims, the core wire of current supplying conductor is typically made of aluminum wire rod which has high heat conducting and transportation capability, and the rod can be connected directly to the LED, so that much larger amounts of heat generated by the LED become efficiently dissipated to the local environment.

As stated in the claims, two or more current supplying conductors may be aligned and stranded together with current supplying cable, for carrying an electrode on the current supplying conductor as by removing a portion of the insulating painted layer, providing a connecting part at an appropriate position on one sidewall, and a firm connection to exposed electrode (connection) of the current supplying conductor is assured. As included in the claims, with formation of a tube-shaped helical current supplying cable by winding, providing a groove on the outer surface of the tube-shaped helical current supplying cable, and mounting an exposed electrode to the core wire at the base of groove, and by adjusting of distance between exposed electrodes in reference to stretching of tube-shaped helical wire, placement positions of the LEDs can be easily determined, optionally. By stretching or shrinking of current supplying cable wound helically, the distance of adjacent LEDs on the strip lamp can be determined at any desired interval by stretching or shrinking. Still more, by the tilting the direction of the groove formed on insulating paint, about the centerline of tube-shaped helical wire, intervals of electrodes can be expanded or contracted.

As appears in the claims, on one sidewall of each of two current supplying conductors aligned and joined together with two current supplying cables, a concave reflector or reflectors are supported lengthwise of the direction of a current supplying cable, and by formation of a flatted exposed electrode extending in the length direction of the current supplying cable along the edge of the reflector, and by direct connection of the shaped or extruded electrode of the LED to a diode connecting part on current supplying cable by soldering or other means, LED light emission is reflected by such reflectors provided on both sides of the current supplying conductor, and strong light flux is obtained by collecting and beaming of a narrow width of light. The reflector can be made of aluminum or inexpensive material, so that manufacturing cost of the reflector is reduced, high heat transfer or transportation rate is obtained, and high emitting light efficiency can be assured.

As appears in the claims, an exposed electrode is formed, by removing insulating paint layer on one sidewall of current supplying cable to form a notch to expose the core wire with two current supplying conductors which are aligned and stranded together, and by direct connection of the extruded electrode of the LED to the exposed electrode of the current supplying cable at the notch by soldering or other means. It is located at the bottom of a V-shaped or U-shaped reflector of which both opposite sidewalls extend toward or face the open direction. LED light emission is reflected by such reflectors provided on both sides of the current supplying conductor, and strong flux with formation of a narrow width beam of light is provided. The reflector is made of aluminum or inexpensive material, so that manufacturing cost of the reflector or reflectors is reduced, high heat transportation or transfer rate is obtained, and high emitting light efficiency is assured.

One end of the current supplying conductor can be deformed or crushed and expanded toward the axial direction, to form a disk-shaped pedestal, with wire crossing the axis of the current supplying conductor. By placing one or more exposed electrodes of LEDs on the pedestal, LED light emission is reflected and collected by the pedestal, so there is no need to provide a reflective mirror, and simple structure makes available and directed strong emission of light. Further, the nature of the aluminum conductor allows extensive shaping, and much larger pedestal diameters can be formed as compared with conductor diameter. Also, as the materials of the conductor and pedestal are the same, heat dissipation rate is high, so heat generated from LEDs is transported efficiently to the local environment. Plural pedestals are typically combined in a concentric circle type cluster placing an electric wire in the center, so that LED light emission is reflected and collected on each pedestal; thus high intensity of light can be obtained by this provided simple structure.

DETAILED DESCRIPTION OF INVENTION

For the first embodiment of this invention, refer to FIG. 1 through FIG. 3. FIG. 1 shows an LED strip lamp that employs a light emitting diode (emission part) 1 and current supplying conductors 2 and 3 connected or to be connected to LED 1. Insulating paint coated wire (examples being Enamel wire, magnet wire) is used for current supplying conductor 2 and 3.

As shown in FIG. 2, using insulating paint coated wire (ex. Enamel wire, magnet wire) as current supplying conductor 2, and 3. Insulating paint layers 21, 31 on connecting parts 20, 30 are removed enabling connection to extruded electrodes 11, and 12 of LED 1 (see FIG. 3), inside conducting wires (core wires) 22, 32 being exposed.

As shown in FIG. 3, LED 1 employs a substrate, emitting part 10 including an emitting layer on laminated nitride semiconductor layers, and extruded or shaped polygonal electrodes 11, 12 provided on the backside of emitting part 10. Extruded or shaped electrodes 11, 12 are connected directly to diode connecting parts 20, 30, respectively, on current supplying conductors 2, 3 and the extruded electrodes (drawing omitted) on LED 1 are connected to conducting wires (core wires) 22 and 32 of the above stated current supplying conductors 2, 3, respectively as by die bonding. Distance L (see FIG. 3) between electrodes 11, 12 of LED 1 and distance W (see FIG. 2) between current supplying conductors 2, 3 are indicated by almost the same dimensions.

Connecting parts 20 (30), as shown in FIG. 4, are provided by locally removing one side of insulating painted layer 21 (31) on current supplying conductor 2 (3) (embodiment shows upper side), whereby top surface of conducting wire 22 (32) is exposed and formed. Diode connecting part 20 (30) has the function of a reflective surface, so exposed portion of conducting wire (core wire) 22 (32) is needed to provide enough room for reflection.

With this structure, the extruded or shaped electrode of the LED is directly connected (die bonding) to current supplying conductor (insulating paint coated wire, namely, enamel wire, magnet wire), so that an associated printed circuit board is no longer needed and distance of LED placement positions can be designed, freely and arbitrarily. Also, a current supplying conductor (insulating paint coated wire, magnet wire) can be plastically deformed at any desired length or configuration in not only two-dimensional but also in three-dimensional forms; therefore LED placement, namely, LED strip lamp placement, is done or made possible at any desired positions. Also, with selection of enamel wire or magnet wire for insulating paint coated wire of current supplying conductor, efficiency of heat dissipation from current supplying conductor is high, and a large amount of heat generated at the LED is transported or transferred to the local environment. The operating temperature of the LED can be decreased, thus emitting light efficiency of the LED is enhanced, and spacing of successive LED placement positions is closer whereby placement density becomes higher. Also, because of direct connection of the LED to the diode connecting part, which is exposed on conducting wire (core wire) of current supplying conductor, the diode connecting part becomes or produces a reflective surface, the effect of collecting light being enhanced, so that additional provision or preparation of a reflective mirror or mirrors is not needed. Further, insulating paint coated wire (ex. enamel wire, magnet wire) for the current supplying conductor, contributes to low cost of material and reduction of manufacturing cost.

In the first embodiment, FIGS. 2 and 3 show current supplying conductors and two extruded electrodes of the LED when the extruded (or polygonally shaped) electrodes are increased to three or more, the same number of current supplying conductors being provided and each polygonally shaped or extruded electrode is connected to a corresponding current supplying conductor. For example, a single emitted color of Red or Blue of the LED requires two each of the LED extruded electrodes and current supplying conductors, and for a dual color LED, three each of the LED extruded electrode and current supplying conductors will be required (or 4 each); and for a triple color LED, four each of the LED extruded electrodes and current supplying conductors will be required (or 6 each); and when three or more current supplying conductors are used, they should be aligned and joined together; also, the diode connecting part is provided by removing (notching) insulating paint on one side wall of the current supplying conductor. The mounting part of the LED can be formed as an electrode.

For the second embodiment, as shown in FIG. 5 and FIG. 6, two current supplying conductors 5, 6 are aligned and joined together (for example helically) to form a current supplying cable 7, which forms tube-shaped helical wire (see FIG. 4) as by winding. By locally removing insulating paint layer or layers 51, 61, where the mounting part of the LED is to be connected, the notched exposed part 50, 60 is formed, exposing the inside of conducting wire 52, 62, the exposed part or parts 50, 60 providing a diode connecting part or parts connected to a mounting part or parts of the LED, respectively.

The outer surface of the helically wound current supplying cable 7, forms a straight line of grooves or notches 71 lengthwise of the axis of the tube-shaped helical wire, and by removing insulating paint layer portions of 51, 61 to expose the core wire 52, 62 at the bottom of grooves or notches, diode connecting parts 50, 60 are formed. With two diode connecting parts 50, 60 as provided, a diode connecting part 70 on the current supplying cable 7 is provided. Current supplying cable 7 can be stranded by use of the plural number of wires.

When the width of a current supplying cable 7 is sufficient the polygonally formed or extruded electrode of the LED is connected to the connecting part 70 of the current supplying cable 7, and corresponding electrodes of individual LEDs are connected to electrodes 50, 60 of individual LEDs respectively, in a row. On the other hand, if the width of the current supplying cable is not wide enough, the helical wire 7 consisting of two current supplying cables 5, 6, can be axially stretched, as in FIG. 6, and the shaped electrodes of corresponding LEDs are then connected to parts 50, 60 of connecting part 70, respectively, as by die bonding or other means.

This described structure makes it possible for adjustment of positioning of LED placement, as at any desired distances, axially, and assures firm connection between LEDs and current supplying cable (current supplying conductor).

By expansion and contraction of helical current supplying cable, the distances between successive LED strip lamps can be adjusted and determined at any desired distances. (Different sections of the helix can be stretched by selected different amounts, to differentially shift LED position or positions). Further, by changing the angularity of the formed grooves about the centerline of the helix, the distances between electrodes is also adjustable. Helical winding of current supplying cable is of great advantage for heat dissipation, and tighter windings provide better transfer or transportation of heat.

A third embodiment is shown in FIG. 7. Two current supplying conductors 100 and 110 are joined together as at insulating paint layer 13, with formation of a parabola shape 111 or composite curved surface inwardly of insulating paint layer 13. Reflective surfaces 111, 112, are at opposite sides of LED 14, placed on insulating paint layer 13, as shown. A pair of mounting parts are provided underneath LED 14, and connected to current supplying conductors 113, 114 by die bonding or other means.

Although the outer surface of the current supplying conductor or conductors 11, 12 is coated by the insulating paint layer 13, the reflective surfaces 111 and 112 are provided by locally removing the insulating paint layer to locally expose current supplying conductor 11, 12, or by potting reflective paint. At the edges of both reflective surfaces 111, 112 bounding or surrounding the insulating paint layer 13, the diode connecting part 113, 114 is formed, and which extends in a straight line along with the edge or edges of reflective surfaces 111, 112. A mounting part is provided underneath of one or more LEDs 14 connected to adjacent diode connecting parts 113, 114. This enables connection of a current supplying conductor with single conductive unit to one pole, and connection of a separate conductive wire to another pole, which is connected to the LED. With this structure, light emission from the LED is reflected by reflective surfaces on a current supplying conductor provided at both sides of the LED, and strong light flux along with a collected narrow width beam of light are obtained. Also, by forming the current supplying conductor to be larger, high heat dissipation efficiency is obtained, and this protects the LED from objectionable high temperature, whereby more effective light emission is enabled.

Figure 8:
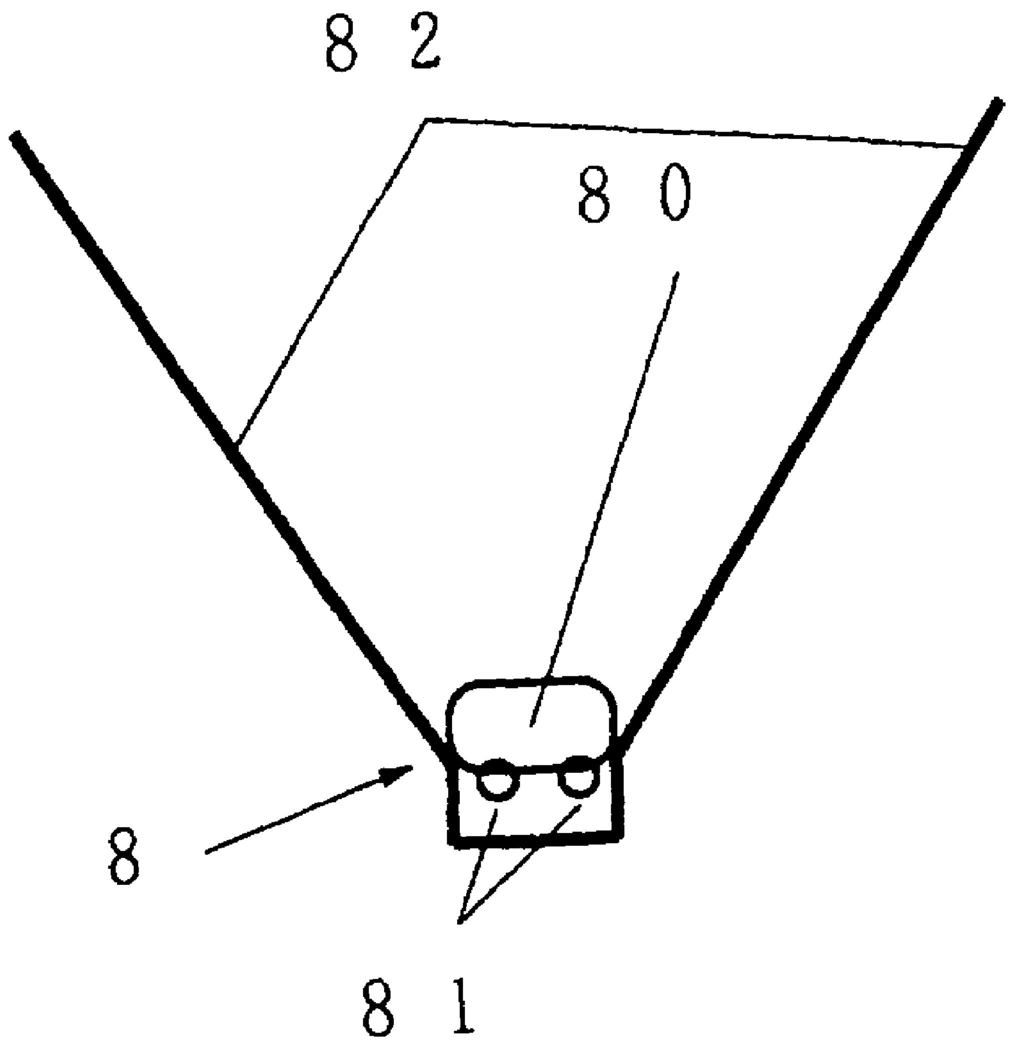
FIG. 8 is a side view of a fourth embodiment of this invention.
Figure 9:
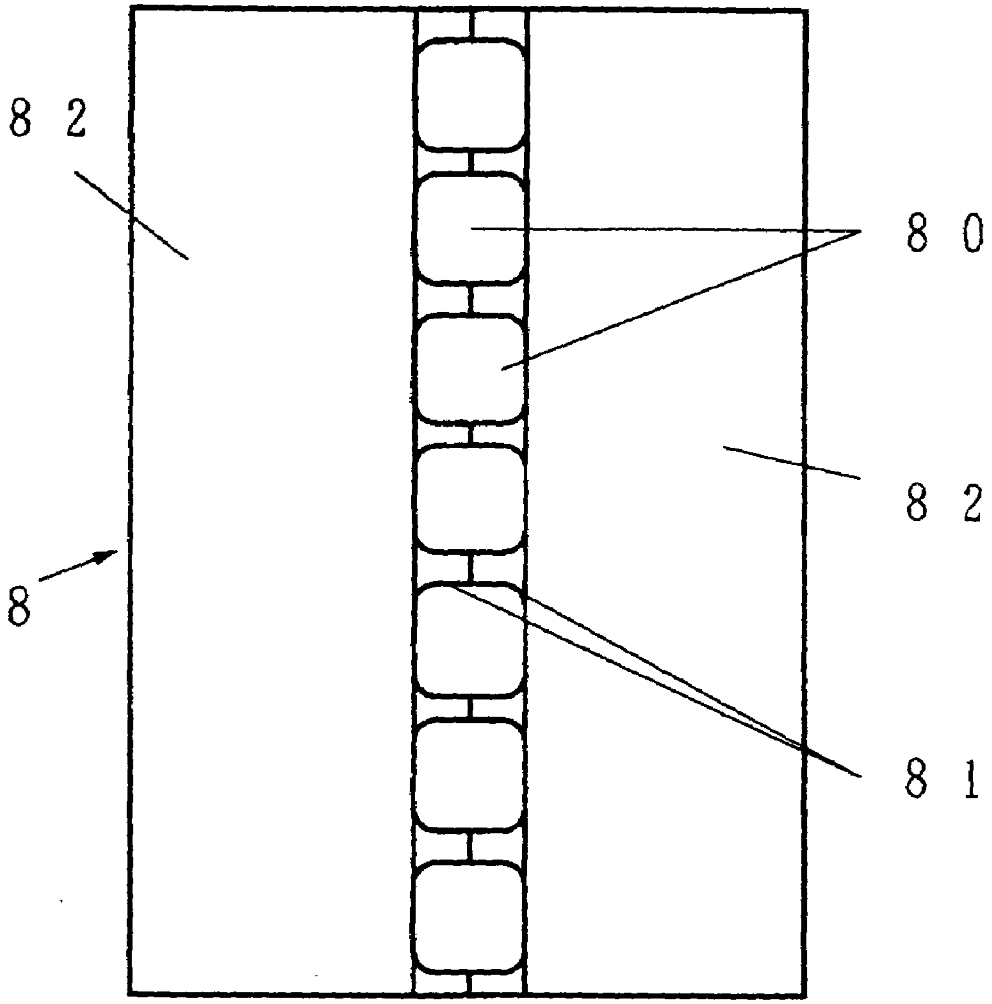
FIG. 9 is a plan view of the fourth embodiment.

The fourth embodiment is shown in FIGS. 8 and 9. By locally removing insulating paint on one sidewall of current supplying cable 81 (upper part of FIG. 8) for two or more current supplying conductors combined together, an LED diode connecting part (not shown) is formed by exposing a conductor surface. A desired number of LEDs 80 is connected to such surfaces by die bonding or other means, inwardly of reflector walls 82 forming a V-shape in cross section. With this structure, as in the third embodiment, light emission from the LED or LEDs is reflected by reflective surfaces on current supplying conductors provided at both sides of each LED, and concentrated, narrow width of flux output is obtained. The reflector is typically made of aluminum or other metal, so that manufacturing cost of the reflector is reduced and high heat dissipation efficiency obtained. Note the row of LEDs in FIG. 9.

Referring now to FIGS. 10, and 11, the fifth embodiment is shown. One extreme end of current supplying conductor 300, which is made of aluminum or copper, is crushed or deformed (flattened) in the long length direction of conductor 300 to form a disk-shaped reflective pedestal 301, and the extruded or shaped electrode of LED 14 is connected to the reflective pedestal 301 carrying one or more LEDs 14. The opposite end of conductor 300 is connected to one pole of a power supply. The ratio of diameter D of the reflective pedestal 301 and diameter d of conductor 300, referred to as deformation ratio D/d, is 4 to 6 in this embodiment. The electrode of each LED 14 is connected by wire bonding to conductive wires 302 and 303, connected to another pole of the power supply.

Using this structure, a reflective pedestal formed and obtained by flattening and extending the end of the conductor for collecting light emitting from the LED, so there is no need to provide an extra reflective mirror. This simple structure makes available strong and efficient flux projection. Also, by using aluminum for the material of conductor, a larger diameter D of the reflective pedestal is available compared with diameter d of the conductor, since aluminum is readily deformable. Further, the reflective pedestal and wire lead are typically made of the same material, so that the rate of heat conductivity is high, and heat transfer cooling of the LED are promoted. By making the reflective pedestal surface concave, greater concentration of collected light is enabled, and strong flux obtained. By setting the deformation rate of the reflective pedestal at D/d=4–6, enhanced LED mounting space is secured.

Figure 12:
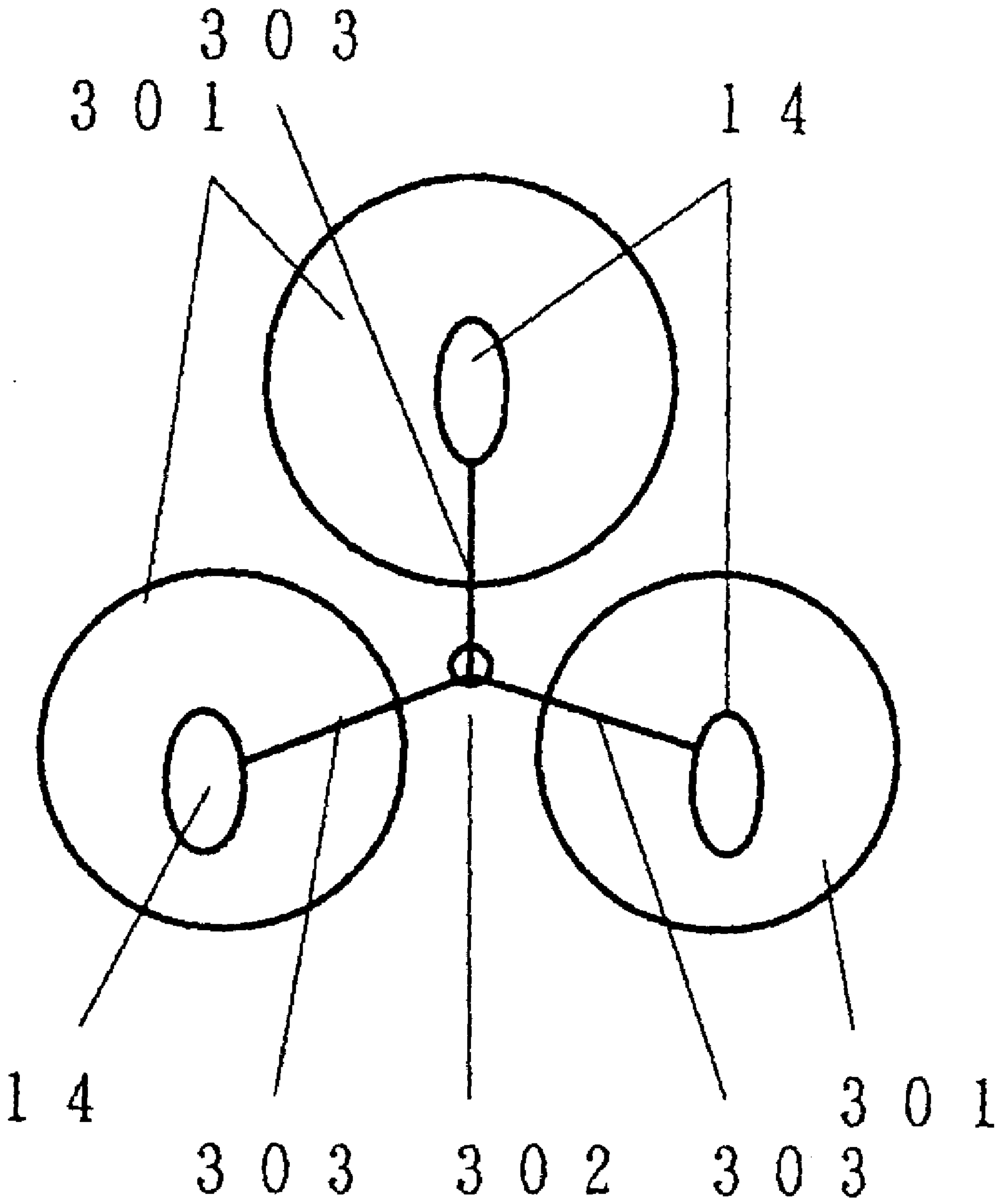
FIG. 12 is a plan view of a sixth embodiment.
Figure 15:
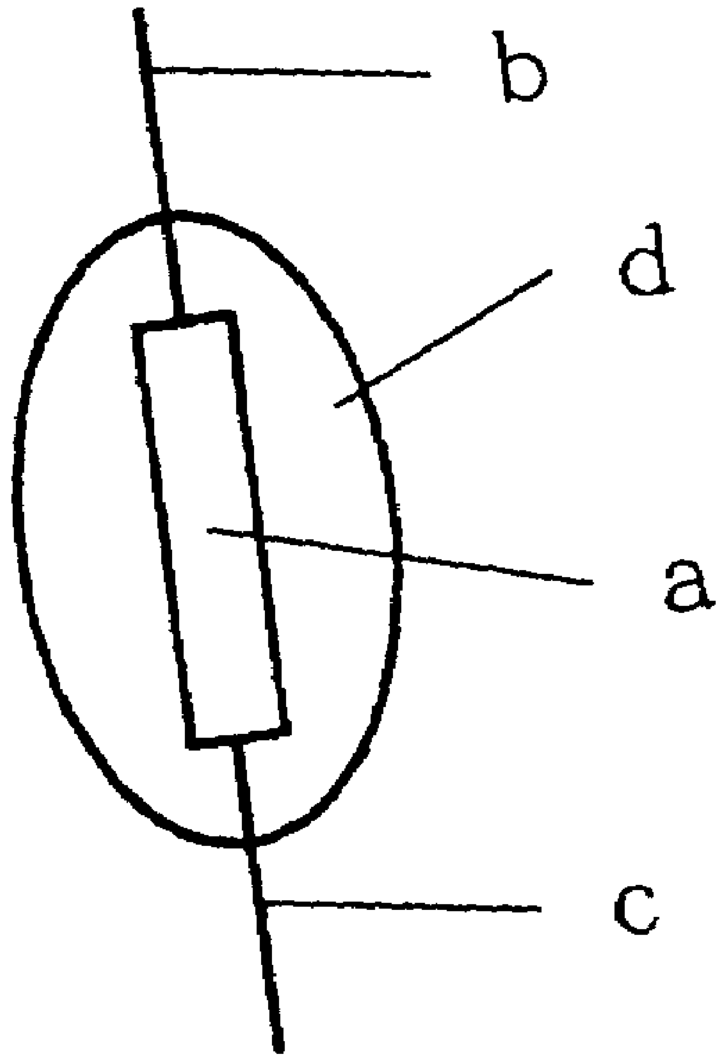
FIG. 15 shows conventional LED structure.

The sixth embodiment shown in FIG. 12 provides plural reflective pedestals 301 in a cluster. Electric wire 302 is located in the center of the cluster. Conductive wire 302 is connected to electrodes of LEDs 14 as by wire bonding 303. Light emission from each LED is reflected and collected by each pedestal, and the simple structure makes available the obtaining of a large intensity of beamed light because of the locations of the plural pedestals.

The seventh embodiment is shown in FIG. 13. Three or more current supplying conductors (insulating paint coated wires) 91, 92, 93 are stranded together to form a polygon cluster in cross section (embodiment shows triangle) and provides a current supplying cable, as a one piece unit. Such a polygon may include a square (4 conductors), hexagon (6 conductors) and others.

Current supplying cable 90, as shown in FIG. 14 as including current supplying conductor 91, conductor 92 appearing in FIG. 13 as aligned, with the outer surface of each current supplying conductor being locally removed to expose the core wires or at 101 and 102. This provides the first diode connecting part or parts. FIG. 14 also shows current supplying conductors 92 and 93 as aligned, and outer surface locally removed to expose the core wires, to provide the second diode connecting part 102, note axial shifting of 101 relative to 102. The third diode connecting parts 103 on 93 are shown as shifted in position relative to 101 and 102.

This structure enables shifted placement of different color LEDs in the current supplying cable 90, as in a selected variety of arrangements for emitting different colors and mixing. Use of stranded current supplying cable is also enabled. Also, since the current supplying cable consists of a plural number of current supplying conductors, they can be plastically deformed and the arrangement of LED placement can be freely made as well as free arrangement of color matching and LED positioning.

EFFECT OF INVENTION

In summary, the invention provides for:

An LED strip lamp comprising a diode and a shaped or extruded electrode, using insulating paint coated wire such as enameled wire as a current supplying conductor, by locally removing an insulating paint layer to expose the core wire of current supplying conductor enabling direct connection (die bonding) of a mounting part of the LED to the current supplying conductor (insulating paint coated wire) PC boards are not needed and distances of LED placement positions are selectable. Also, the current supplying conductor (insulating paint coated wire) can be deformed to desired configuration as in two or three dimensions. Furthermore, the current supplying conductor made of insulating paint coated wire (enamel wire, magnet wire) provides high efficiency of heat dissipation and efficient transfer of heat generated from LEDs to the local environment. As a result less temperature rise of LEDs and enhanced light emission efficiency are provided. High density of LED placement positions is also available. In addition, material and production cost are reduced because of the use of insulating paint coated wire for the current supplying conductor.

As in claim 2, use of current supplying cable, which is aligned and joined together with two or more current supplying conductors, and a diode connecting part on an exposed local sidewall region of the current supplying cable, assures firm connection with the diode connecting part on the current supplying cable. As in claim 3, a helical wire may be provided by winding of the current supplying cable, with a groove located at the outer surface of current supplying cable, the core wire exposed at the bottom of groove or notch to provided an exposed electrode. Stretching of the helical wire adjusts distance between diode connecting parts so that desired placements of LEDs at any desired intervals can be selected. By expansion or contraction of the current supplying cable of helical wire axially of the helix distances in between adjacent LEDs can be controlled at any desired length. Changing the rotary tilt of groove locations about that centerline of helical wire, also serves to control the spaces between electrodes.

As in claim 4, on a sidewall of the current supplying cable, aligned and joined together with two current supplying conductors, a concave reflector is provided to extend along long length direction of current supplying cable, providing a flattened exposed extending edge of the reflector. Direct connection of the formed electrode of the LED to the current supplying cable, as by soldering or other means, enables strong flux to be obtained, with collection of a narrow width of light and reflection of emitting light from the LED at reflecting surfaces provided at both sides of LED. One highly advantageous reflector is made of aluminum or other metals, reducing the reflector cost and providing high heat dissipation efficiency. High light emitting efficiency is also achieved.

With respect to claim 5, exposing the core wire by locally removing one sidewall of the insulating painted layer of current supplying cable, which was formed by aligning and flatly joining together two current supplying conductors, enables a direct connection of extruded shaped electrode of the LED to the exposed electrode of current supplying cable as by soldering or other means. That connection is typically placed inside of or between V shaped reflector sidewalls. Emission of LED light is reflected by the reflective surfaces of the current supplying conductors provided at opposite sides of the LED enabling provision of strong flux along with collected narrow width of light.

As in claim 7, formation of a disk shaped reflective pedestal extending crosswise of the axis line of the current supplying conductor enables connection of the exposed electrode of or electrodes of one or more LEDs to a pedestal. Emitted light of the LED is collected at a reflective surface of the pedestal, so there is no need to provide any extra reflective mirror, is and simple construction enables strong light protection. Also, the conductor consists of aluminum with advantages referred to above. Further, the lead wire and reflective pedestal may consist of the same metallic material, and continuous formation, so that the rate of heat dissipation is high with efficient heat to local environment.

As in claim 8, multiple reflective pedestals can be clustered together with an electric wire in the center of the cluster, light emission of each LED being collected and reflected by each reflective pedestal. A large intensity of light is thereby obtained, with simple construction.

As in claim 9, three or more insulating paint coated wires used as current supplying conductors are aligned and combined together to form a one piece unit forming a polygon in cross section. By locally exposing the core wire on the outer surface of each current supplying cable and by shifting the position of diode connection part controlled placement of different color light emitting LEDs is enabled, and a variety of arrangements for emitting color is also made available using stranded current supplying cable. Also, current supplying cable may consist of a plural number of current supplying cables, combined together to be plastically deformed whereby the arrangement of LED placement is freely accomplished as well as free arrangement of color matching and LED positions.

Referring to claim 9, the location of diode connecting part on the core wire exposed on outer side of current supplying cable, by combining 3 or more current supplying conductors of insulating paint coated wires which are aligned and stranded together to form one piece unit, forming a polygon on cross section, is shifted away each other on each sidewall. By twisting current supply cable, a variety of placement of emitting color can be achieved at desired position. Also, the plural number of current supplying conductor is combined together, so plastically deformed arrays, arrangement of LED position can be done freely as well as matching color and emitting position.

I claim:

1. LED strip lamp comprising a light emitting diode and extruded electrodes characterized in that a shaped electrode of that LED is fixed directly to a diode connecting part on a current supplying conductor, by die bonding or other fixing means, an insulating painted layer on the current supplying conductor being locally absent, exposing a core wire, wherein the current supplying conductor comprises a metal wire rod having said insulating painted layer thereon, and further characterized in that a selected connecting part is formed on one sidewall of the current supplying conductor by removal of the insulating painted layer, and wherein a current supplying conductor is aligned and joined together with two or more current supplying conductors, and further characterized in that the distance between successive diode connecting parts is adjustable by stretching said conductor which has the form of a tube-shaped helical cable which forms a diode connecting part at the bottom of a groove formed on the exposed core wire, and another groove is formed at the periphery of the tube-shaped current supplying cable, which is wound helically.

2. LED strip lamp as defined in claim 1 and characterized in that the core wire consists of aluminum wire rod.

3. The strip lamp of claim 1 wherein a notch is formed at the locus of locally absent extent of the painted layer.

4. LED strip lamp characterized in that a polygonally shaped electrode of an LED is fixed directly to a diode connecting part on current supplying cable, by die bonding or other fixing means, with provision of a concave reflector surrounding the long length direction of the current supplying cable, with provision of a flat on a diode connecting part which extends in the elongated length direction of the current supplying cable, along with a reflector on one sidewall of the current supplying cable aligned and stranded together with two current supplying conductors, and further characterized in that the cable has the form of a tube-shaped helical cable which forms a diode connecting part at the bottom of a groove formed on a locally exposed core wire within said cable, and another groove is formed at the periphery of the tube-shaped current supplying cable, which is wound helically.

5. The strip lamp of claim 4 wherein a series of offset LEDs are located along a length dimension of the cable.

6. The strip lamp of claim 5 wherein notches are formed on the cable at the loci of direct fixing of the LEDs to the cable.

7. The strip lamp of claim 6 wherein the cable has helical shape and the notches extend in a row.

8. The method which including selectively angularly rotating portions of a helix formed by the cable of claim 7 to selectively position the LEDs, axially the helix.

9. The method which includes differentially adjusting the axial length of a helix formed by the cable of claim 6, to selectively locate the LEDs, axially of the helix.

10. LED strip lamp characterized in that the combination of a polygonal cross section electrode of an LED is fixed directly to a diode connecting part on a current supplying cable by die bonding or other fixing means, said part located at the bottom of the closed portion of a V-shaped reflector having sidewalls that extend toward an open direction, and the current supplying cable provides a diode connecting part by local removal of an insulating painted layer to expose a core wire, on one sidewall of the current supplying cable, which is aligned and stranded together with two current supplying conductors, and further characterized in that the cable has the form of a tube-shaped helical cable which forms a diode connecting part at the bottom of a groove formed on the exposed core wire, and another groove is formed at the periphery of the tube-shaped current supplying cable, which is wound helically.

11. LED strip lamp characterized in that one or more LEDs are provided on a reflective pedestal by die bonding or other fixing means, the reflective pedestal being disc-shaped crossing in right angular relation to the axis of a current supplying conductor, provided by deforming and expanding one end of the current supplying conductor toward the axis direction, to form the pedestal, and further characterized in that the cable has the form of a tube-shaped helical cable which forms a diode connecting part at the bottom of a groove formed on a locally exposed core wire within the conductor, and another groove is formed at the periphery of the tube-shaped current supplying conductor, which is wound helically.

12. LED strip lamp as stated in claim 11 characterized in that an electric wire is located at the center of plural reflective pedestals as claimed, the wire and pedestals combined together.

13. LED strip lamp characterized by locating a provided diode connecting part on a core wire exposed at the outer side of a current supplying conductor, three or more combined current supplying conductors of insulating paint coated wires being aligned and stranded together to form a one piece unit, forming a generally polygon shape in cross section, the wires shifted away from each other to offset the LEDs relative to one another, and further characterized in that said conductor has the form of a tube-shaped helical cable which forms a diode connecting part at the bottom of a groove formed on the exposed core wire, and another groove is formed at the periphery of the tube-shaped current supplying cable, which is wound helically.

* * * * *